US00RE34088E

United States Patent [19]

Tsang et al.

[11] E Patent Number: Re. 34,088

[45] Reissued Date of Patent: Oct. 6, 1992

[54] ON-THE-FLY ERROR CORRECTION

[75] Inventors: Bruce E. Johnson, Minnetonka; Kinhing P. Tsang, Plymouth, both of Minn.

[73] Assignee: Seagate Technology, Inc., Scotts Valley, Calif.

[21] Appl. No.: 690,524

[22] Filed: Apr. 23, 1991

Related U.S. Patent Documents

Reissue of:

[64] Patent No.: 4,890,287
Issued: Dec. 26, 1989
Appl. No.: 166,085
Filed: Mar. 9, 1988

[51] Int. Cl.[5] ..... G06F 11/12

[52] U.S. Cl. ..... 371/37.8; 371/39.1; 371/40.1

[58] Field of Search ..... 371/37.1, 37.2, 37.7, 371/37.8, 38.1, 39.1, 40.1

[56] References Cited

U.S. PATENT DOCUMENTS

| | | | |
|---|---|---|---|
| 4,030,067 | 6/1977 | Howell | 371/37.7 |
| 4,360,916 | 11/1982 | Kustedjo | 371/37.8 |
| 4,473,902 | 9/1984 | Chen | 371/37.8 |
| 4,599,722 | 7/1986 | Mortimer | 371/37.1 |
| 4,623,999 | 11/1986 | Patterson | 371/37.8 |

*Primary Examiner*—Charles E. Atkinson
*Attorney, Agent, or Firm*—Kinney & Lange

[57] ABSTRACT

On-the-fly error correction is provided by using the remainder from division of the encoded codeword by its generator polynomial to look up error values and locations in a memory. Alternatively, the syndromes are so employed. The values in the memory are predetermined and preassociated with each remainder or syndrome set. Alternatively, syndrome $S_0$ directly yields the error value.

9 Claims, 11 Drawing Sheets

ON-THE-FLY ERROR CORRECTION

Matter enclosed in heavy brackets [ ] appears in the original patent but forms no part of this reissue specification; matter printed in italics indicates the additions made by reissue.

BACKGROUND OF THE INVENTION

The invention relates to the field of error correction and more particularly to error correction for magnetic recording devices, including disk drives.

BRIEF DESCRIPTION OF THE PRIOR ART

"On-the-fly" error correction has not been widely incorporated into high speed magnetic recording devices, especially disk drives, for at least two reasons: unreliability caused by errors exceeding code correction and/or detection capacity, and high latency caused by the complexity of the mathematics involved in error correction, and/or the extreme complexity of the mathematics to perform on-the-fly error correction. The problems compound one another. Increasing the capacity of the code to handle errors simultaneously increases latency and complexity.

Each codeword, which conventionally comprised a complete sector, has to be decoded and corrected prior to reading and decoding the next codeword. Where correction takes time, the next codeword to be read and decoded could pass a disk drive's read head. This would necessitate waiting one disk revolution until that codeword was again under the read head.

IBM U.S. Pat. Nos. 4,494,234 and 4,504,948, both to Patel, represent the closet prior art known to applicant. Here, multibyte error correction is provided on-the-fly, however, the hardware to do so is extremely complex, employing hundreds if not thousands of exclusive-OR ("XOR") gates.

SUMMARY OF THE INVENTION

The invention provides on-the-fly error correction with a relatively simple set of hardware. Essentially, on decode, the remainder after division by the generator polynomial is used to look up the error values and locations in a memory. Alternatively, the syndromes may be employed. Further, the generator polynomial may be structured so that one syndrome directly yields the error value and the remainder indexes the error location in the memory. Finally, the decoder may further be structured so that the error location is found by multiplying the other syndrome by the corresponding field element and comparing the result to the error value or the first syndrome.

Multiple error correction is provided by interleaving. A massive error which may cause miscorrection is preferably detected by use of conventional error detection on the result of the correction. This may take the form of an less elaborate ECC.

DESCRIPTION OF THE PREFERRED EMBODIMENTS

Figure 1:
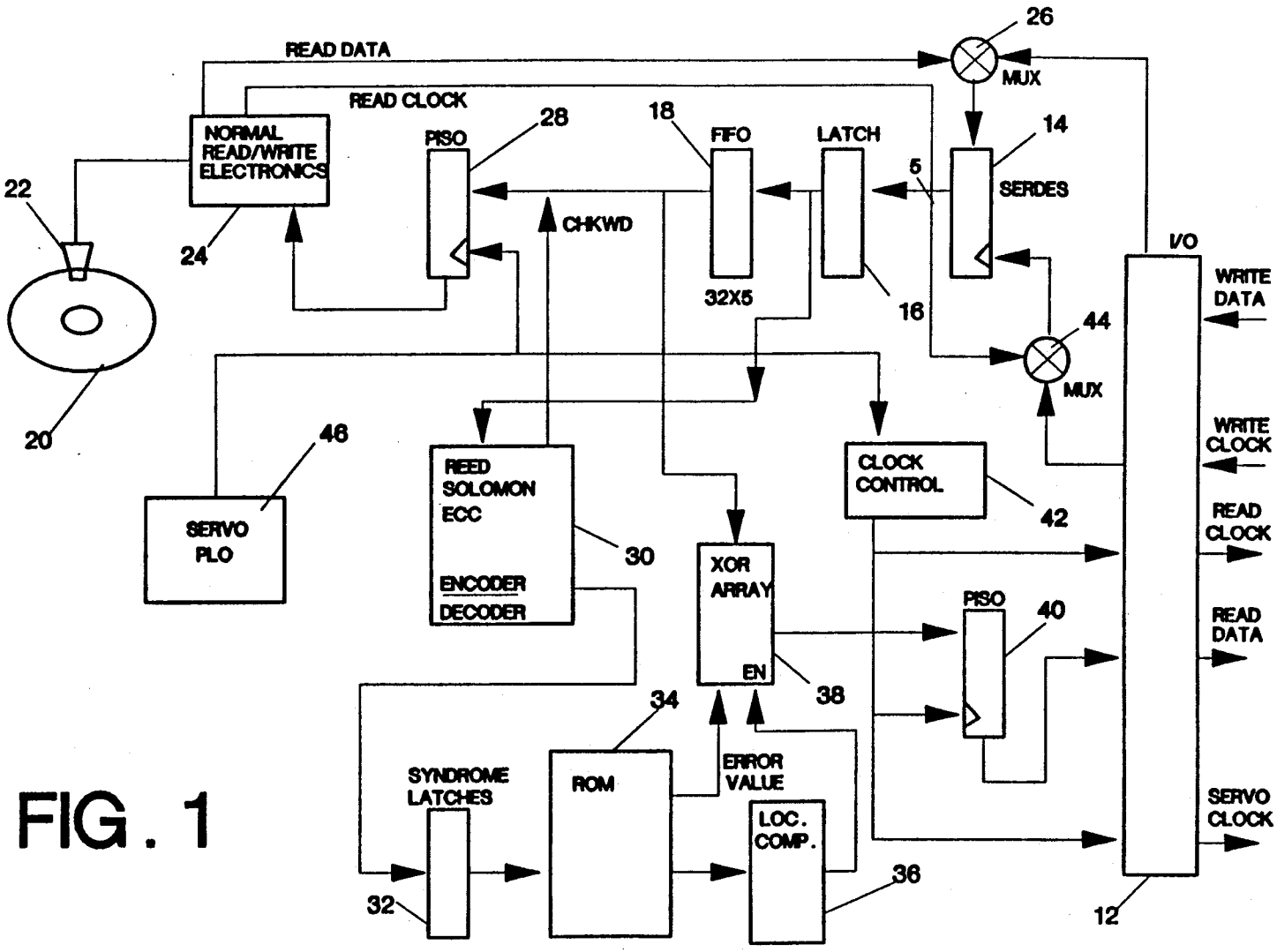
FIG. 1 is a block diagram of a preferred embodiment of the present invention.

FIG. 1 is a block diagram of an on-fly error correction circuitry of a disk drive according to the present invention. Data is serially input and output of the error correction circuitry through I/O interface 12. Read and write clocks for timing data transfer are provided and a servo clock is also provided for tracking control through this interface. Also shown are normal read/write electronics 24 for transferring actual information to and from the drive's disk 20 through transducer head 22. This same circuitry generates a read clock in response to read data. A servo phase locked oscillator 46 receives servo input from either transducer 22 or from a separate transducer head, not shown (a design choice), and outputs a servo clock to I/O 12 through clock control 42 and to the clock input of a parallel to serial converter 28 for timing write data input to read/write electronics 24. This much of the apparatus is conventional.

Serial write data is input into serializer/deserializer (SERDES) 14 through multiplexer 26 under control of the write clock through multiplexer 44. The SERDES outputs the write data in parallel, symbol by symbol, to a latch 16, whose output is connected to FIFO buffer 18, and as well to a REED SOLOMON ECC ENCODER/DECODER 30, which divides the input symbols by a generator polynomial. When the servo PLO indicates that the transducer head 22 is appropriately located to write data, data symbols are clocked out of FIFO 18, in the order received, to parallel to serial converter (PISO) 28 which provides the data serially to the read/write electronics. At the end of every data segment, which comprises a predetermined number of symbols, the remainder from division of the data symbols of the data segment by a generator polynomial is clocked out of the ENCODER/DECODER 30 to PISO 28 and appended to the data segment recorded on the disk. This remainder comprises in the preferred embodiment where a single error correcting code is employed two checkword symbols.

Essentially the reverse procedure is used during read. To read data from the disk, the read/write electronics first detects s sync mark denoting the beginning of a data sector. This initializes read timing and the read clock. Subsequent serial read data is coupled through multiplexer 26 to SERDES 14 under control of the read clock through clock control 42. The SERDES 14 converts the serial input to parallel and outputs the read data symbols through latch 16 to FIFO 18 and ENCODER/DECODER 30. The latter circuit divides the received codeword symbols, including the checkwords, by the generator polynomial. The remainder (and the syndromes) after this division uniquely identifies both the location and value of an error. The remainder (while not technically a syndrome) is latched into syndrome latches 32, whose output index a memory ROM 34 having predetermined error values and locations uniquely associated with particular remainders. (Alternatively, the syndromes may be used to look up the error values and location. This will be discussed in relation to FIGS. 7 and 8). The indexed error value is output to one input set of Exclusive-OR (XOR) array 38. The indexed error location is output to a location comparator. Thereafter, the data symbols contained in FIFO 18 are clocked, one by one, through the XOR array 38, while at the same time the location comparator is clocked (which preferably is a counter which counts from the loaded count up to its maximum count). When the location comparator indicates that symbol in error is now being clocked through, it enables the XOR output, which is the corrected read data symbol, to substitute for the read symbol in error. The read data symbols and substituted corrected read data symbols are connected to a parallel to serial converter (PISO) 40, which converts the symbols to serial and outputs it on the read data output of I/O 12.

Note that only the information portions of a codeword are retained in FIFO 18, while the full codeword including checkwords in input to the ENCODER/DECODER 30.

In the preferred embodiment, each symbol is five bits. Thus the SERDES 14 output is five bits, latch 16 is five bits, and all PISO's convert five bits to serial. The remainder-checkwords after both encode and decode comprise two five-bit symbols.

Each non-zero decode remainder uniquely identifies a single error value and location. There are $2^{10}$ different such possibilities. ROM 34 therefore contains 1024 10-bit constants, each ten bits comprising a five bit error value and a five bit location number. These constants may be calculated, but are preferably determined by creating a codeword using the encoder or a simulated encoder, inducing all known possible errors in the codeword, dividing each of the erroneous codewords by the generator polynomial and associating the remainder with the known error value and location.

In an alternative preferred embodiment, two codewords are interleaved. This permits detection of burst errors in two adjacent symbols without providing a two-error correcting code.

In this alternative interleaved arrangement, the information portion of each codeword comprises 16 symbols, for a total of 32 data symbols in the two interleaved codewords.

Figure 2:
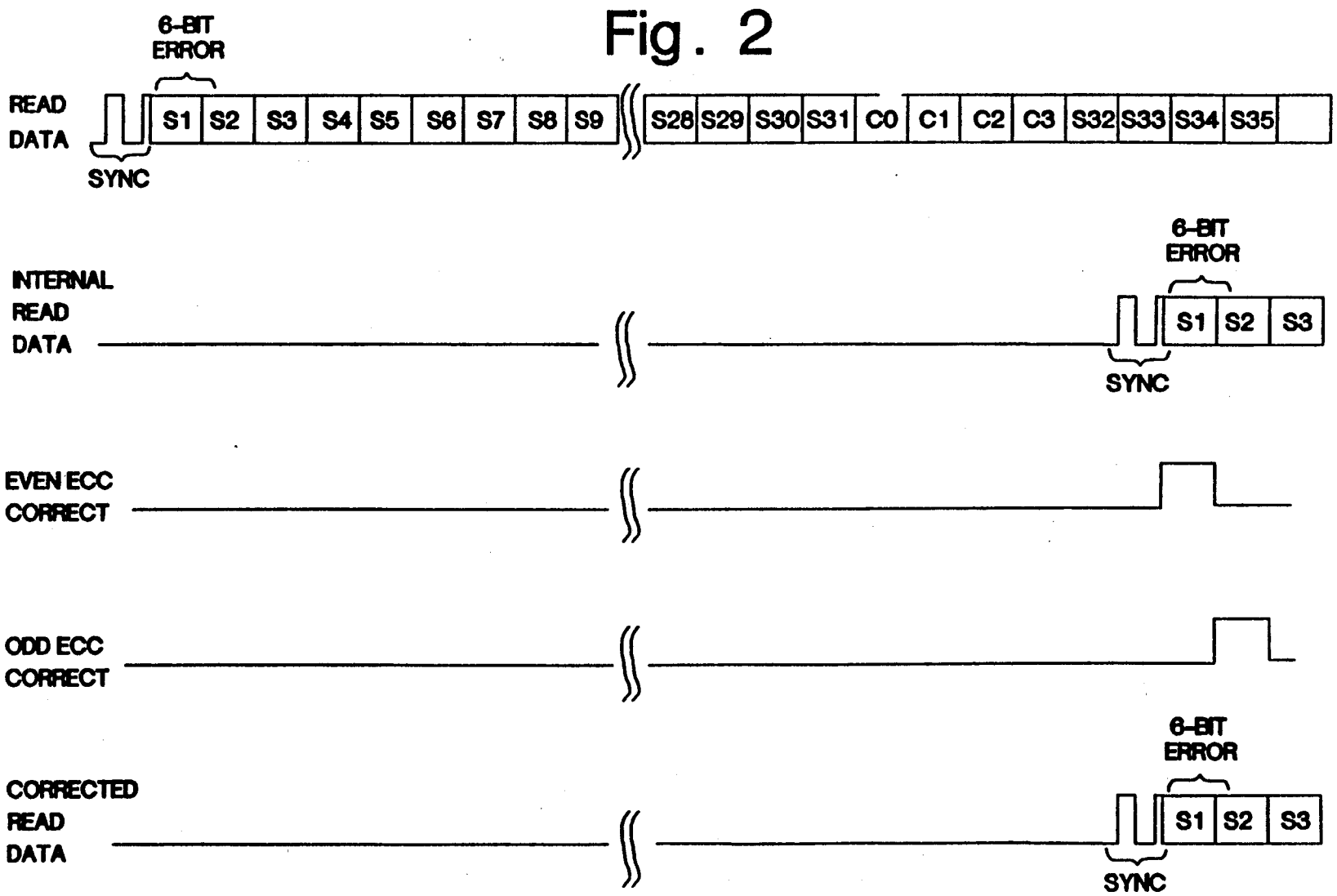
FIG. 2 is a timing diagram of a preferred interleaved arrangement showing the correction of a six-bit error.

The interleaving arrangement is shown in FIG 2. Each sector begins with a sync mark which is a predetermined bit pattern. The sync mark of a sector itself comprises the first even data symbol. This is followed by data symbols 1–31 and checkword symbols 0–3. Each odd symbol is associated with one codeword. Each even symbol with another. The two codewords comprise a codeword group and are decoded simultaneously.

Each data sector preferably contains a plurality of interleaved codeword groups, the number being a design choice. There is no boundary between codeword groups, as the present invention permits reading, decoding and correction on-the-fly.

The latency period is determined by the time to decode one codeword group, in this embodiment, thirty-six symbols, plus gate delays of elements 32, 34, 38 and 40 of FIG. 1. In FIG. 2, the latency is indicated by the gap between the READ DATA line and the INTERNAL READ DATA line. Also shown in the figure are a hypothetical six-bit error in two consecutive symbols, S1 and S2, and their correction in response to separate EVEN and ODD CORRECT timing pulses from separate location decode electronics.

Figure 3:
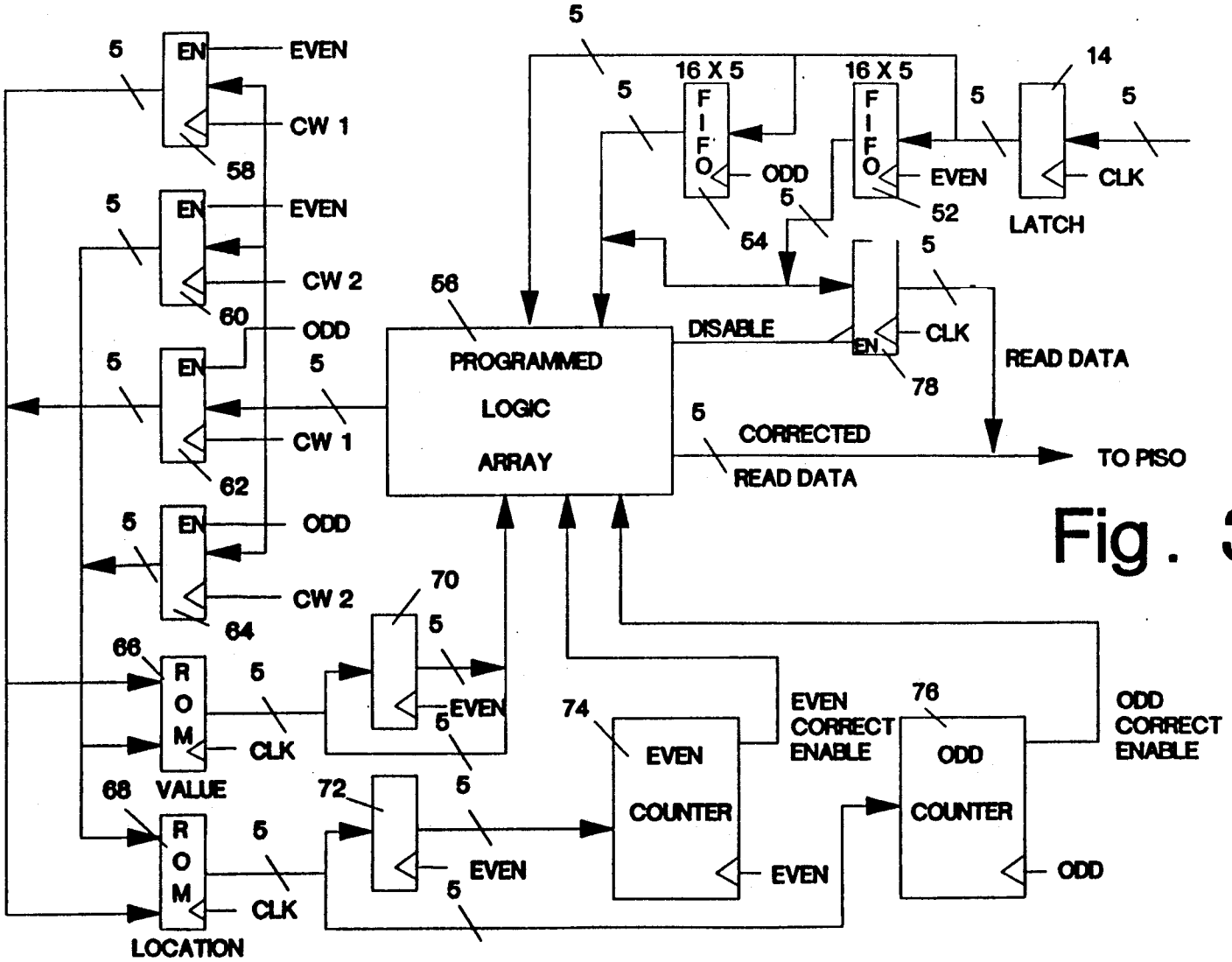
FIG. 3 is a block diagram of an interleaved decoder according to the present invention.

FIG. 3 is a block diagram of an interleaved decoder according to the preferred embodiment. Data from SERDES 14 (FIG. 1) is input to latch 16 under control of a clock from clock control 42 which responds to the READ CLOCK from electronics 24 (FIG. 1). The input the latch comprises both interleave codewords. These are input unmodified to a programmed logic array (PAL) 56, which divides them by a generator polynomial. As well the data portions of the two codewords are separate by being input to two separate FIFO's 52, 54 under control of EVEN and ODD clocks from clock control 42.

The PAL contains two generator polynomial dividers 80 and 82 (FIG. 4) which separate the input codeword group into its components by input latches 88 and 92 alternatively enabled again by EVEN and ODD signals from the clock control. Each of the generator polynomial dividers has the same general construction, an input XOR gate 84 whose other input is connected to the output of XOR gate 86 and whose output is connected to a register R0 and output latch 90. R0 in turn is connected to Galois multiplier g1, whose output is connect as one input to XOR 86, and to register R1. The output of R1 is multiplied by Galois multiplier g0 and provided as a second input to XOR 86. As those skilled in the art appreciate, this arrangement of elements provides Galois division by a generator polynomial of the form:

$$X^2+g_1X+g_0$$

In the preferred embodiment, the generator polynomial g(X) is $$X^2+\alpha^2X+\alpha^0,$$

from roots $\alpha^{15}$ and $\alpha^{16}$, where $\alpha^i$ is an m-tuple field element of $GF(2^5)$ modulo $P(X)=X^5+X^2+1$. Thus, $g1=\alpha^2=00100$, and $g0=\alpha^0=00001$, where 00100, e.g., are the coefficients of the m-tuple $$\alpha^i=A_4\alpha^4+A_3\alpha^3+A_2\alpha^2+A_1\alpha^1+A_0\alpha^0, \text{ and } \alpha \text{ is a root of } P(X), \text{ i.e., } P(\alpha)=\alpha^5+\alpha^2+1=0$$

After every symbol of the respective codewords has been clocked into R0, the remainder is available at respective latches 90 and 94 in response to two more clocks. During these clocks, a timing signal CW OUT clocks the latches. The output from the PAL is provided on a CHECKWORD OUT output from both latches 90 and 94. Because they share the same output, the latches are alternately enabled by the aforementioned EVEN and ODD signals. This CHECKWORD OUT output is provided during encode to PISO 28 as shown in FIG. 1, and to four "syndrome" latches 58-64 shown in FIG. 3. The two symbols of the even checkwords are latched by latches 58 and 60 in response to successive signals CW 1 and CW 2. The two symbols of the odd checkwords are latched by latches 62 and 64 in response to successive signals CW 1 and CW 2. After the latches have be loaded with the checkword symbols, they are provided, two at a time to ROMS 66 and 68, on the ROM's ten-bit address input lines. First the two even latches 58 and 60 are provided as coordinated by the EVEN signal. Next the two odd latches 62 and 64 are provided as coordinated by the ODD signal.

Each of the ROM's are 1024×5 random access. The contents of ROM 66 comprise the 1024 five-bit error values as indexed by the checkwords input on its ten-bit address lines. The contents of ROM 68 comprise the 1024 five-bit error locations as indexed by the checkwords input on its ten-bit address lines. If fewer than the maximum number of possible codeword symbols are used, as in the preferred embodiment where only 16 data symbols are used and the maximum codeword length is 31 symbols, each ROM contents can be correspondingly reduced because of the reduced number of possible error values and locations.

The even error value is temporarily latched in latch 70, and both even and odd error values are provided to PAL 56 for subsequent Galois addition to the erroneous read data symbol for the even and odd codewords of a group. The even and odd error locations are provided to respective count-up counters 74 and 76.

Next the contents of FIFO's 52 and 54 are alternatively clocked out under control of EVEN and ODD signal both to PAL 56 and to latch 78, which has a disable input connected to PAL. Normally, each READ DATA symbol clocked into it is clocked out to PISO 40. However, if a counter 74 or 76 indicates a error location, the PAL disables the output of the latch 78 and enables the CORRECTED READ DATA output to PISO 40.

Figure 4:
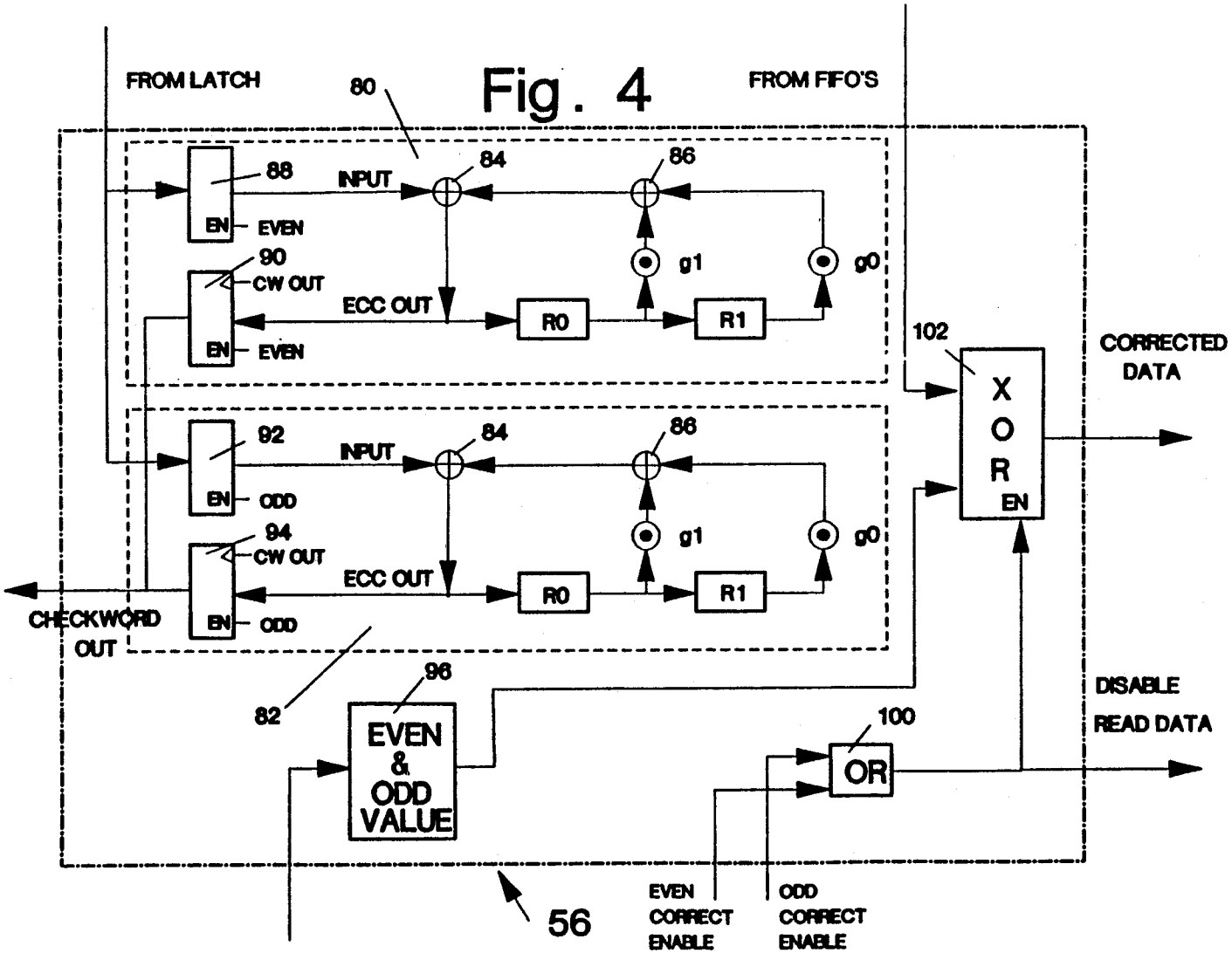
FIG. 4 is a block diagram of the contents of the programmed logic array of FIG. 3.

FIG. 4 shows the portions of this process contained in PAL 56. The EVEN and ODD error values 96 are provided as one input to XOR array 102. The other input to each is the output of FIFO's 52 and 54. When a error location has been determined, the symbol in error is present at this input to the XOR array. The XOR array output is enabled under the control of OR gate 100 whose inputs are the EVEN or ODD CORRECT ENABLE from counters 74 and 76. The output from the OR gate 100 also disables the READ DATA latch 78. The output from the XOR array is provided on the CORRECTED DATA output to PISO 40., thereby substituting for the symbol in error.

If no symbol is in error for a codeword, the remainder from division by the generator polynomial is zero. Zero could index an error location value that would not count out in counters 74 or 76, or alternatively, means, not shown, could be provided to detect all zero remainders and inhibit operation of the counters.

Figure 5:
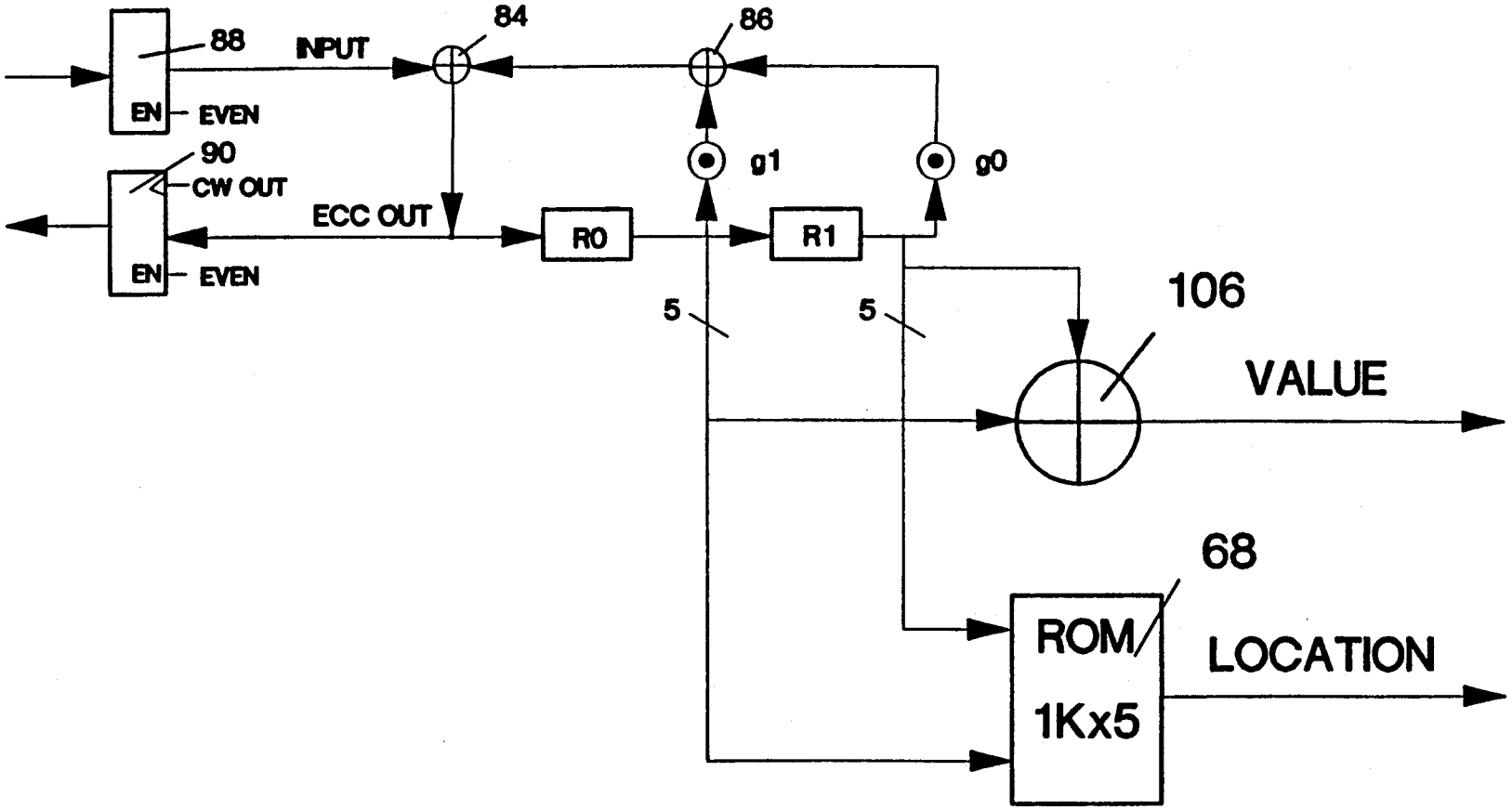
FIG. 5 is an alternative decoder arrangement where syndrome $S_0$ provides the error value.

FIG. 5 is an alternative arrangement where the roots of the generator polynomial are chosen such that syndrome $S_0$ directly yields the error value. The even codeword is shown. An identical arrangement is made for the odd codeword in the preferred interleaved embodiment. In this arrangement, the roots are $\alpha^0$ and $\alpha^1$, yield a generator polynomial $$G(X)=X^2+\alpha^{18}X+\alpha^1,$$

and $g1=\alpha^{18}=00011$ and $g0=\alpha^1=00010$.

Here all symbols of the codeword are clocked through the generator polynomial divider of the figure, the last two inputs being set to zero. The sum of the contents of R0 and R1 represent the remainder divided by $X-\alpha^0$, which is syndrome $S_0$. The sum is formed by providing the outputs of these registers to XOR array 106, the output of which, $S_0$, is the error value.

The remainder, as before, also uniquely identifies an error location. Here the remainder is provides via the outputs of registers R0 and R1 to the address inputs of ROM 68, as before, to index the error location.

Figure 6:
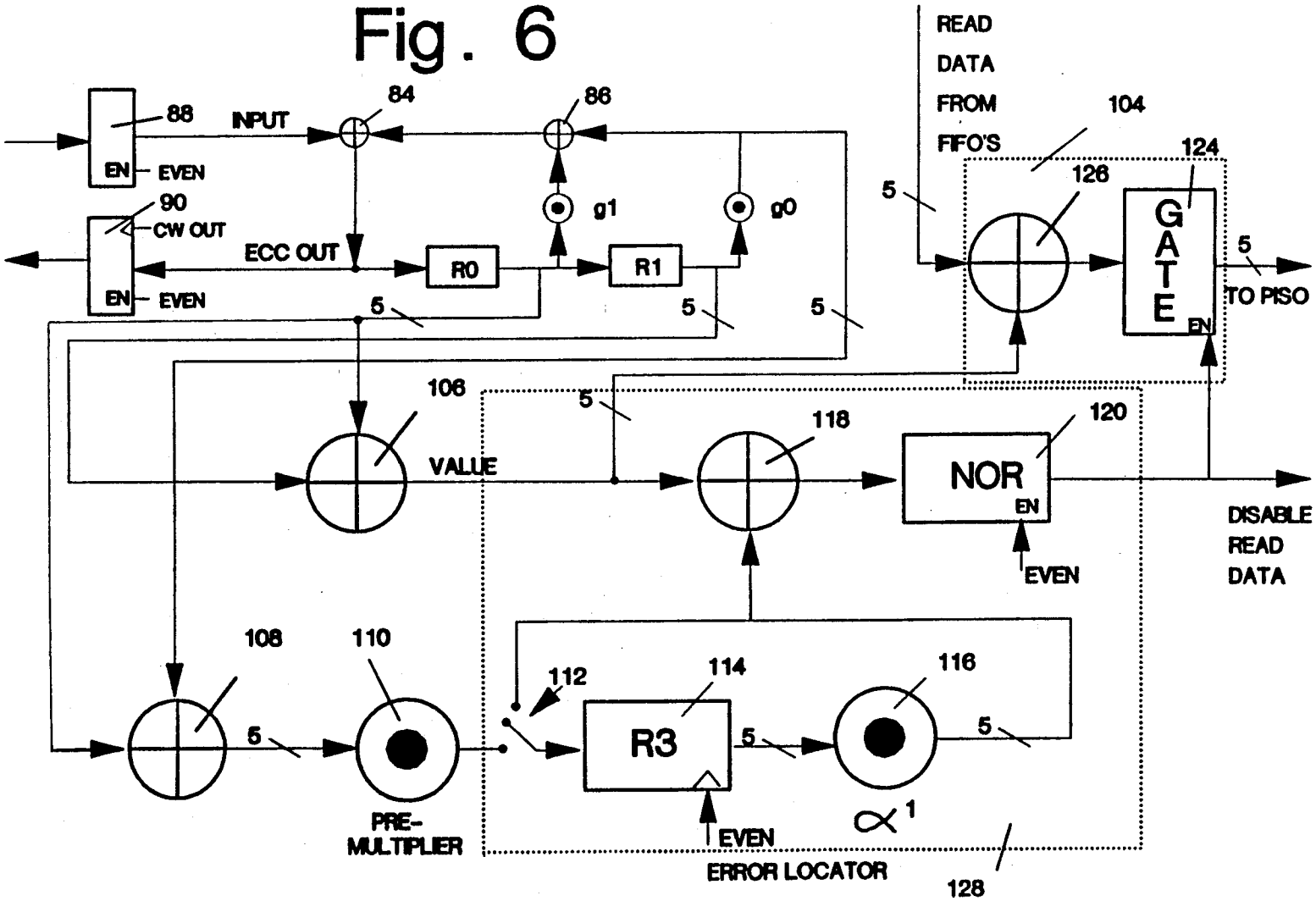
FIG. 6 is an alternative decoder arrangement where syndrome $S_0$ provides the error value and syndrome $S_1$ in conjunction with an error locater provides the error location.

In a still further alternative arrangement, the syndrome $S_1$ may be used with the same generator polynomial to yield a value which provides an error location by the circuit shown in FIG. 6. This additionally eliminates the need for the error location ROM 68.

As before, $S_0$, the output of XOR 106, yields the error value. The division of the remainder by $X-\alpha^1$ yields syndrome $S_1$. The coefficient of multiplier g0 is $\alpha^1$. Thus the remainder divided by $x-\alpha^1$ happens to be the output of multiplier g0 summed with the output of R0. This sum is provided by XOR array 108 the input of which are the aforementioned outputs.

The error location may be found using $S_1$ by comparing the product of $S_1$ and $\alpha^1$, $i=1,2,\ldots 31$ to the error value at the location i. The product may be determined by multiplying $S_1$ by $\alpha^i$.

A codeword in $GF(2^5)$ has as many symbols as field elements, i.e., 31. In the preferred embodiment, however, less than all possible codeword symbols are non zero. Specifically, only 18, with only the 16 most significant of these comprising data. Thus the $31-18=13$ most significant symbols of a codeword are not important to correct erroneous data. Therefore, the first possible data error location is 14 and the first thirteen locations can be ignored. This is achieved by multiplying $S_1$ by $\alpha^{13}$, preferably, or alternatively by multiplying $S_1$ by $\alpha^1$ 13 times. Premultiplier 110 multiplies $S_1$ by $\alpha^{13}$.

The scaled syndrome, $S_1{}^{13}$, is input to error locator 128 through switch 112 and into register R3. Thereafter switch 112 closes on the multiplier loop which includes register R3 and $\alpha^1$ multiplier 116. The output of R3 is multiplied by $\alpha^1$ and is input to XOR array 118 and R3. The XOR array's other input is the error value from XOR array 106. If the scaled error location and error value are identical the corresponding data symbol is the one in error. Also, if the two inputs are equal, the output of the XOR array are all zero. This is tested by NOR gate 120, which goes high only when all inputs are zero.

As each data symbol (even or odd) is about to be forwarded to PISO 40, it s first input to latch 78 and also provided to XOR arrays 38 (FIG. 1), the even one of which 104 is shown in FIG. 6. The other input to the XOR array is the corresponding even or odd error value. In FIG. 6, the error value from XOR array 106 is input to XOR 126, the output of which is gated by gate array 124. The gate array output is enabled when NOR 120 indicates the detection of an even codeword error location. This output is connected to the CORRECTED READ DATA output of FIG. 3. At the same time, the NOR output is also connected to latch 78 and disable that latch's output when an even error location is found. This results in the CORRECTED READ DATA substituting for READ DATA at the input to PISO 40.

Each time PISO 40 and latch 78 are clocked for an even symbol, R3 is clocked to load a new port of $S^1$ and place on the input to XOR array 118 the next power of $S^1$. The process continues until the entire even codeword is processed.

The apparatus shown in FIG. 6 is for the even codeword only. It is repeated for the odd codeword. Each also has means to enable the NOR gate 120 output only when a corresponding even or odd symbol is present at latch 78.

Figure 7:
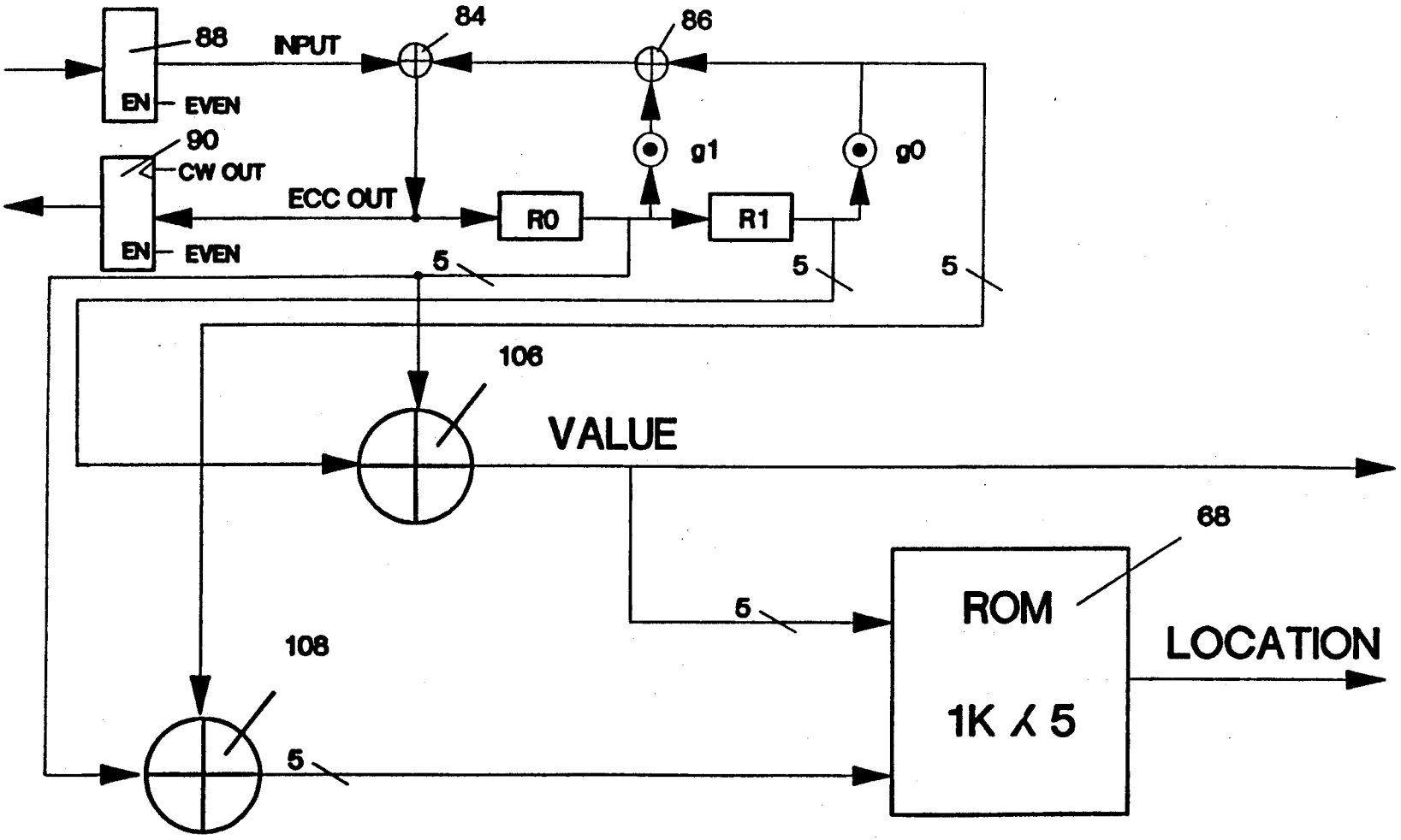
FIG. 7 is an alternative decoder arrangement where syndrome $S_0$ provides the error value and both syndromes index an error location in a memory.

FIG. 7 shows a variation on the even decoder segment of FIG. 5. As the syndromes, as well as the remainder, in combination are uniquely associated with a single error location, they are provided from XOR's 106 ($S_0$) and 108 ($S_1$) to ROM 68 to look up preassociated error locations.

Figure 8:
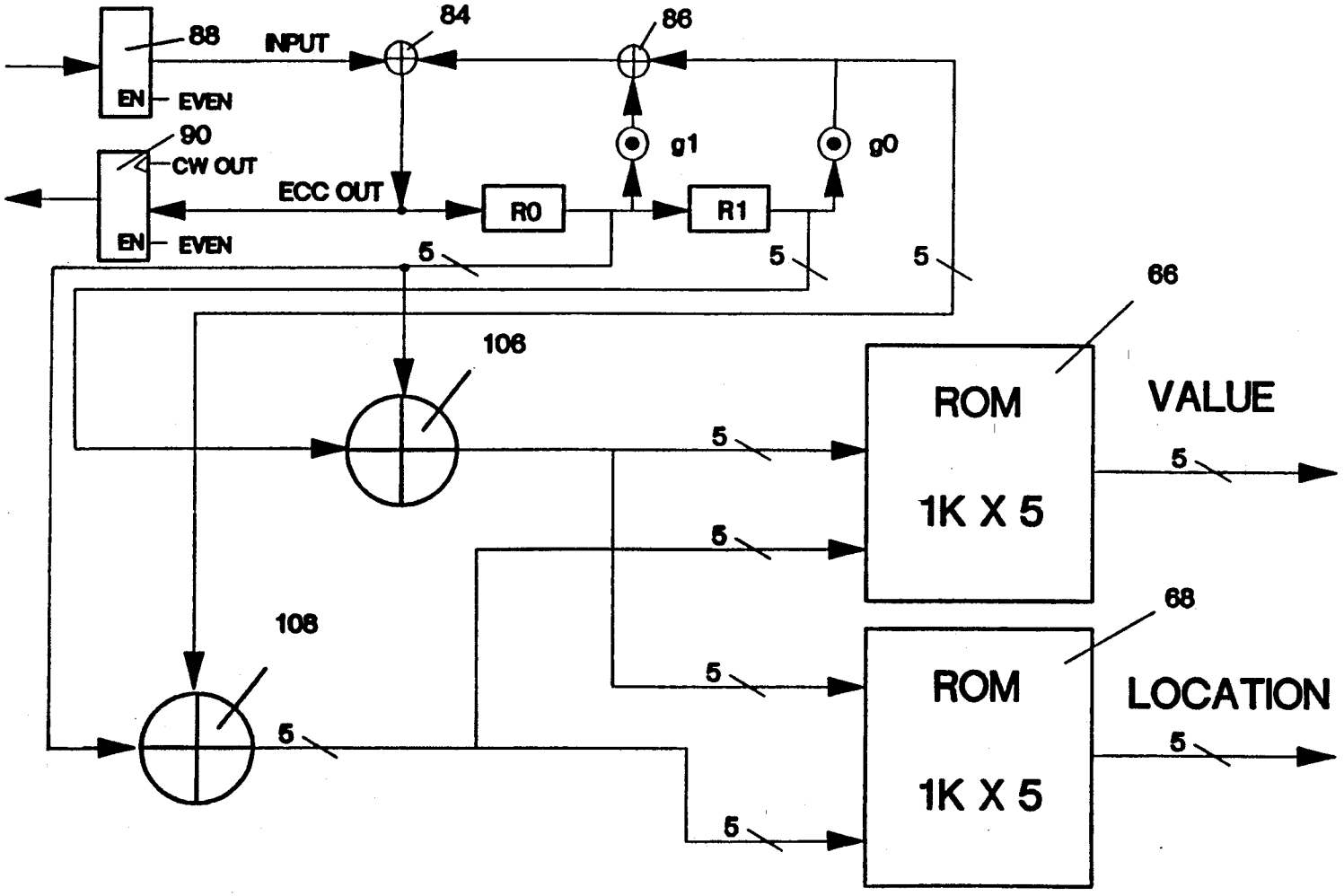
FIG. 8 is an alternative decoder arrangement where both syndromes index both error values and locations in a memory.

FIG. 8 shows a variation on FIGS. 5, 7 and 3 wherein the syndromes are employed to look up both the preassociated error values and location from ROM 66 and 68 respectively.

As shown in these figures, the syndromes are formed by dividing the remainder by the roots of the generator polynomial. There are other ways of determining syndromes from a codeword. One example, shown in Fritze, U.S. Pat. No. 4,584,686, divides the codeword itself by the roots of the generator polynomial.

Figure 9:
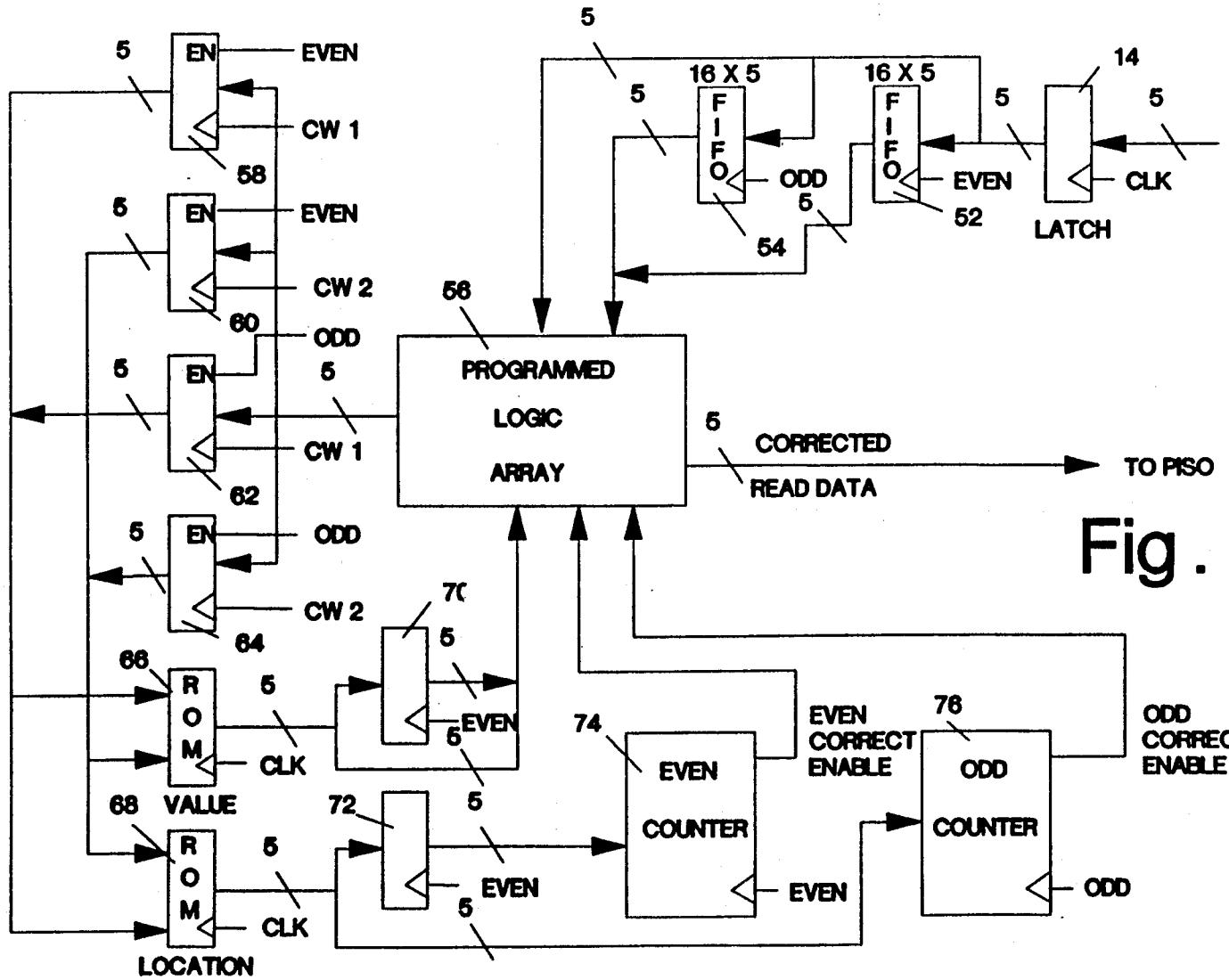
FIG. 9 is an alternative preferred embodiment wherein all FIFO data us funnelled through the XOR gates of the PLA.

FIG. 9 is a schematic of an alternative interleaved decoder arrangement from that of FIG. 3 wherein latch 78 is eliminated. Here the both even and odd symbols are provided to PAL 56 as before, and output unmodified if the symbol is not in error, but output corrected if in error.

Figure 10:
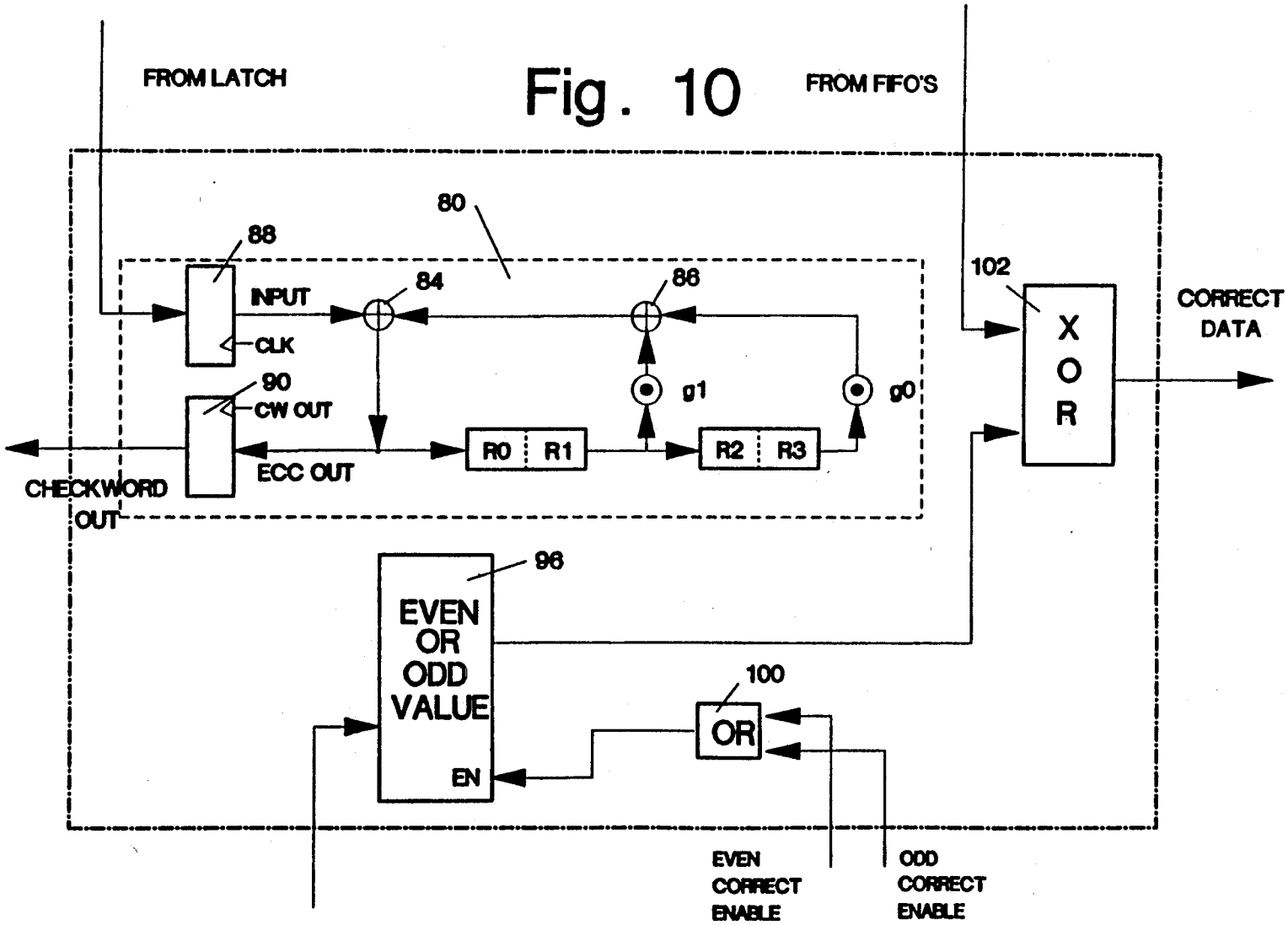
FIG. 10 is schematic of an alternative preferred interleaved encoder/decoder.

FIG. 10 shows this variation, plus an alternative interleaved encoder/decoder 80. Here, both even and odd symbols from the FIFO's are input to XOR 102. The other input is from gate 96, whose output is normally all zeroes unless enabled by OR gate 100 when either an even or odd error location has been determined by counters 74 and 76 (FIGS. 3 or 9). When enabled by OR gate 100, the even or odd error value then present at gate 96 passes to the other input to XOR array 102 where it corrects the data symbol in error from the FIFO's. In both cases, the results of the XOR are correct, and are forwarded to PISO 40.

Also shown in the figure is an alternative preferred encoder/decoder 80. This replaces the pair of encoder/decoders 80 and 82 from FIG. 4.

In this figure, register R0–R1 and R2–R3 are shift registers which have two array cells. Essentially, at each clock R0 copies the five bits on its input and R1 copies the five bits on R0 and places these bits on its output. R2–R3 operate the same way. In this manner, both interleaved data segments or codewords, are input each clock through input latch 88, but are effectively separated into two separate codewords by the shift registers R0–R1 and R2–R3. The output is the same. The arrangement reduces the need for duplicate multipliers g0, g1, etc.

Figure 11:
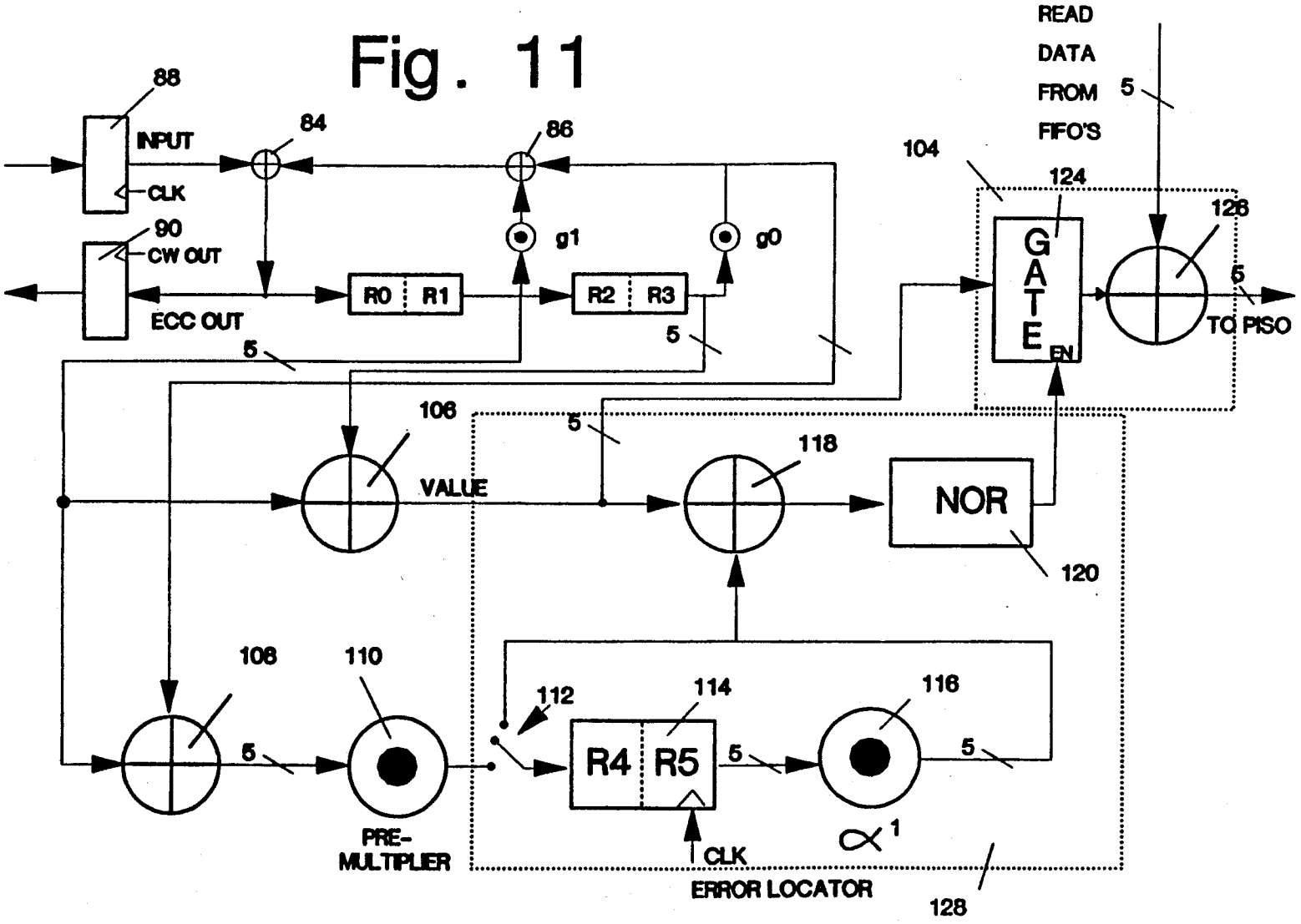
FIG. 11 is a schematic of an alternative preferred interleaved encoder/decoder and correction circuitry.

FIG. 11 is a preferred variation from the error locator arrangement of FIG. 6 employing the shift register arrangement of FIG. 10. Here R3 of error locator 128 has been replaced with shift register R4–R5 which functions identically to shift registers R0–R1 and R2–R3. On alternate clocks, the even or odd error location is available from the output of NOR gate 120 and the error value on the output of XOR array 106. If the NOR gate 120 indicates an error location is present, it enables gate 124 to pass the error value through to XOR array 126 which corrects the data symbol in error. However, if an error location is not present, gate 124 is not enabled and outputs all zeroes, and the data from FIFO's passes through XOR 126 uncorrected.

Other variations within the spirit and scope of the invention will occur to those skilled in the art.

We claim:

1. On-the-fly error correction apparatus comprising:

means for reading an encoded codeword from a data storage device and simultaneously supplying said codeword, symbol by symbol, to a buffer and to a divider means for dividing the encoded codeword by its generator polynomial;

said divider means comprising at least two registers and a corresponding number of Galois field multipliers, and resultant in said registers after all symbols of the codeword have been divided comprising a remainder;

means responsive to said divider registers after all said codeword symbols have been divided for looking up an error location and value in a memory and for outputting the error value to a latch and the error location to a counter; and means responsive to said latch; said counter, and said buffer for correcting an incorrect symbol of said codeword using the error value in said latch as located by the error location contained in said counter.

2. On-the-fly error correction apparatus comprising:

means for reading an encoded codeword from a data storage device and simultaneously supplying said codeword, symbol by symbol, to a buffer and to a divider means for generating from the encoded codeword at least two syndromes;

said divider means comprising at least two registers and a corresponding number of Galois field multipliers, the values of the multipliers being chosen such that the resultant in said register after all symbols of the codeword and a number of zero-valued symbols, the number corresponding to the number of registers, have been divided comprising syndromes $S_0$ and S1;

means responsive to said at least two syndromes contained in said divider means registers for looking up an error location and value in a memory and for outputting the error value to a latch and the error location to *a* counter; and means responsive to said latch, said counter, and said buffer for correcting an incorrect symbol of said codeword using the error value in said latch as located by the error location contained in said counter.

3. On-the-fly error correction apparatus comprising:

means for reading an encoded codeword from a data storage device and simultaneously supplying said codeword, symbol by symbol, to a buffer and to a divider means for generating from the encoded codeword a syndrome and a remainder, said syndrome comprising an error value;

said divider means comprising at least two registers and a corresponding number of Galois field multipliers, the values of the multipliers being chosen such that the resultant in said the lowest-order register after all symbols of the codeword and a number of zero-valued symbols, the number corresponding to the number of registers, have been divided comprising syndrome $S_0$;

means responsive to the remainder in said registers for looking up an error location in a memory and for outputting the error value to a latch and the error location to *a* counter; and means responsive to said latch, said counter, and said buffer for correcting an incorrect symbol of said codeword using the error value in said latch as located by the error location contained in said counter.

4. Apparatus according to claim 3 wherein codeword is formed from a generator polynomial having the root $\alpha^0$ and said syndrome is the formed from the root $\alpha^0$.

5. On-the-fly error correction apparatus comprising:

means for reading an encoded codeword from a data storage device and simultaneously supplying said codeword, symbol by symbol, to a buffer and to a divider means for generating from the encoded codeword at least two syndromes, a first of said syndromes comprising an error value;

said divider means comprising at least two registers and a corresponding number of Galois field multipliers, the values of the multipliers being chosen such that the resultant in the lowest-order register after all symbols of the codeword and a number of zero-valued symbols, the number corresponding to the number of registers, have been divided comprising syndrome $S_0$;

means responsive to said at least two syndromes in said registers for looking up an error location in a memory and for outputting the error value to a latch and the error location to *a* counter; and means responsive to said latch, said counter, and said buffer for correcting an incorrect symbol of said codeword using the error value in said latch as located by the error location contained in said counter.

6. Apparatus according to claim 5 wherein said codeword is formed from a generator polynomial having the root $\alpha^0$ and said first syndrome is the formed from the root $\alpha^0$.

[7. On-the-fly error correction apparatus comprising:

means for reading an encoded codeword from a data storage device and simultaneously supplying said codeword, symbol by symbol, to a buffer and to a divider means for generating two syndromes in a pair of registers from a codeword encoded by means of an irreducible polynomial P(X) having a root $\alpha$ and a finite field of elements $\alpha^i$ modulo P(X), a first of said syndromes in a first register comprising an error value;

locator means responsive to said first register and a second register containing the second of said syndromes for comparing the value of the first syndrome with the value of the field element $\alpha^i$ times the second syndrome until the values are equal, the power of $\alpha^i$ when the values are equal comprising the error location; and means responsive to said first register, said locator means, and said buffer for correcting an incorrect symbol of said codeword using the error value in said first register as located by the error location determined by said locator means.]

[8. Apparatus according to claim 7 wherein said codeword is formed from a generator polynomial having the root $\alpha^0$ and said first syndrome is the formed from the root $\alpha^0$.]

[9. Apparatus according to claim 8 wherein said codeword is formed from a generator polynomial having the root $\alpha^1$ and said second syndrome is the formed from the root $\alpha^1$.]

*10. An on-the-fly error correction apparatus, comprising:*

*reading means for reading an encoded codeword from data storage media, the codeword encoded by means of an irreducible polynomial P(X) having a root $\alpha$ and a finite field of elements $\alpha^i$ modulo P(X);*

*a buffer, coupled to the reading means, for storing the codeword;*

*divider means, coupled to the reading means and including first and second divider registers and first and second Galois field multipliers, for generating a first divider register value and a second divider register value from the codeword, for storing the first divider register value in the first divider register, and for storing the second divider register value in the second divider register;*

*first syndrome generating means, coupled to the divider means, for summing the first divider register value and the second divider register value to obtain a first syndrome of the codeword, the first syndrome comprising an error value;*

*second syndrome generating means, coupled to the divider means, for summing the first divider register value and the output of the first Galois field multiplier to obtain a second syndrome of the codeword;*

*error locator means, coupled to the second syndrome generating means and the first syndrome generating means, for comparing the error value with the value of the second syndrome times the field element $\alpha^i$ until the values are equal, the power of $\alpha^i$ when the values are equal comprising an error location corresponding to the error value; and*

*correction means responsive to the buffer, the error locator means, and the first syndrome generating means, for correcting an incorrect symbol of the codeword using the error value as located by the error location determined by the error locator means.*

*11. Apparatus according to claim 10 wherein said codeword is formed from a generator polynomial having the root $\alpha^0$ and said first syndrome is formed from the root $\alpha^0$.*

*12. Apparatus according to claim 11 wherein said codeword is formed from a generator polynomial having the root $\alpha^1$ and said second syndrome is formed from the root $\alpha^1$.*

* * * * *